United States Patent
Kudrna et al.

(10) Patent No.: US 10,424,635 B2
(45) Date of Patent: Sep. 24, 2019

(54) HIGH VOLTAGE SEMICONDUCTOR DEVICE WITH GUARD RINGS AND METHOD ASSOCIATED THEREWITH

(71) Applicant: Littelfuse, Inc., Chicago, IL (US)

(72) Inventors: Filip Kudrna, Roynov (CZ); Roman Malousek, Frenstat (CZ)

(73) Assignee: Littelfuse, Inc., Chicago, IL (US)

( * ) Notice: Subject to any disclaimer, the term of this patent is extended or adjusted under 35 U.S.C. 154(b) by 42 days.

(21) Appl. No.: 15/092,294

(22) Filed: Apr. 6, 2016

(65) Prior Publication Data

US 2017/0294506 A1  Oct. 12, 2017

(51) Int. Cl.
| | |
|---|---|
| H01L 29/06 | (2006.01) |
| H01L 27/06 | (2006.01) |
| H01L 29/739 | (2006.01) |
| H01L 29/10 | (2006.01) |
| H01L 29/861 | (2006.01) |
| H01L 29/16 | (2006.01) |

(52) U.S. Cl.
CPC ...... *H01L 29/0623* (2013.01); *H01L 27/0629* (2013.01); *H01L 29/0619* (2013.01); *H01L 29/0638* (2013.01); *H01L 29/7395* (2013.01); *H01L 29/1095* (2013.01); *H01L 29/16* (2013.01); *H01L 29/861* (2013.01)

(58) Field of Classification Search
CPC .................. H01L 29/0623; H01L 27/0629
USPC ......................................... 257/484, 487, 495
See application file for complete search history.

(56) References Cited

U.S. PATENT DOCUMENTS

| | | | | |
|---|---|---|---|---|
| 4,707,719 A | * | 11/1987 | Whight | H01L 29/0619 257/489 |
| 5,028,548 A | * | 7/1991 | Nguyen | H01L 21/74 438/488 |
| 5,266,831 A | | 11/1993 | Phipps et al. | |
| 5,959,345 A | | 9/1999 | Fruth et al. | |
| 6,407,413 B1 | * | 6/2002 | Kawamoto | H01L 27/0255 257/133 |
| 7,230,313 B2 | | 6/2007 | Yedinak et al. | |
| 7,582,918 B2 | | 9/2009 | Takahashi | |
| 2003/0218220 A1 | * | 11/2003 | Takahashi | H01L 29/0619 257/409 |
| 2005/0167694 A1 | * | 8/2005 | Takahashi | H01L 29/0696 257/127 |
| 2006/0267091 A1 | * | 11/2006 | Takahashi | H01L 29/0619 257/341 |
| 2007/0215898 A1 | * | 9/2007 | Ozeki | H01L 29/7397 257/139 |
| 2007/0278672 A1 | * | 12/2007 | Tooi | H01L 29/0619 257/734 |

(Continued)

*Primary Examiner* — Lex H Malsawma
*Assistant Examiner* — Eric W Jones (57) ABSTRACT

An electronic device including a substrate, a semiconductor element disposed on the substrate, and a plurality of guard rings at least partially surrounding the semiconductor element, wherein adjacent guard rings are spaced apart by a substantially uniform distance as measured along an entire length of the guard rings, and at least one of the plurality of guard rings has a flared portion. In an embodiment, at least one of the plurality of guard rings electrically floats. In another embodiment, the plurality of guard rings are disposed at least partially below a primary surface of the substrate. In an embodiment, the electronic device is a high voltage MOSFET or an IGBT.

17 Claims, 6 Drawing Sheets

(56) References Cited

U.S. PATENT DOCUMENTS

| | | | |
|---|---|---|---|
| 2011/0042714 A1* | 2/2011 | Ogura | H01L 29/0619 257/139 |
| 2012/0132954 A1* | 5/2012 | Kouno | H01L 29/0619 257/140 |
| 2013/0248925 A1* | 9/2013 | Gejo | H01L 29/7397 257/139 |
| 2014/0203393 A1* | 7/2014 | Kawakami | H01L 29/8611 257/471 |
| 2015/0048450 A1* | 2/2015 | Naito | H01L 29/402 257/337 |
| 2015/0340356 A1* | 11/2015 | Naito | H01L 29/405 257/49 |

\* cited by examiner

HIGH VOLTAGE SEMICONDUCTOR DEVICE WITH GUARD RINGS AND METHOD ASSOCIATED THEREWITH

FIELD OF THE DISCLOSURE

The present disclosure relates to electronic devices, and more particularly to electronic devices including guard rings.

RELATED ART

Certain semiconductor devices, particularly those used in power applications, must be capable of achieving high breakdown voltage in a small area. Breakdown voltage for power devices is often unstable due to voltage gradients found within the substrate of the device. Insulated-gate bipolar transistors (IGBT), for example, operate under high loading conditions, often consisting of many devices connected in parallel. IGBT devices are designed to control high loads. Industries continue to demand improved control and breakdown voltages for power devices with decreasing size.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In accordance with one or more embodiments described herein, an electronic device includes a substrate, a semiconductor element disposed on the substrate, and a plurality of guard rings at least partially surrounding the semiconductor element. A clamp diode extends across a periphery region of the electronic device toward the semiconductor element. At least one of the guard rings can include a flared portion having a width greater than the width of the guard ring at any other location not at the flared portion. In an embodiment, at least two of the guard rings can include flared portions. In an embodiment, the guard rings are spaced apart equal, or substantially equal, distances from one another, as measured along the entire lengths of the guard rings. Embodiments of electronic devices described herein may have higher breakdown voltages in reduced space, reducing chip size and increasing circuit density.

Figure 1:
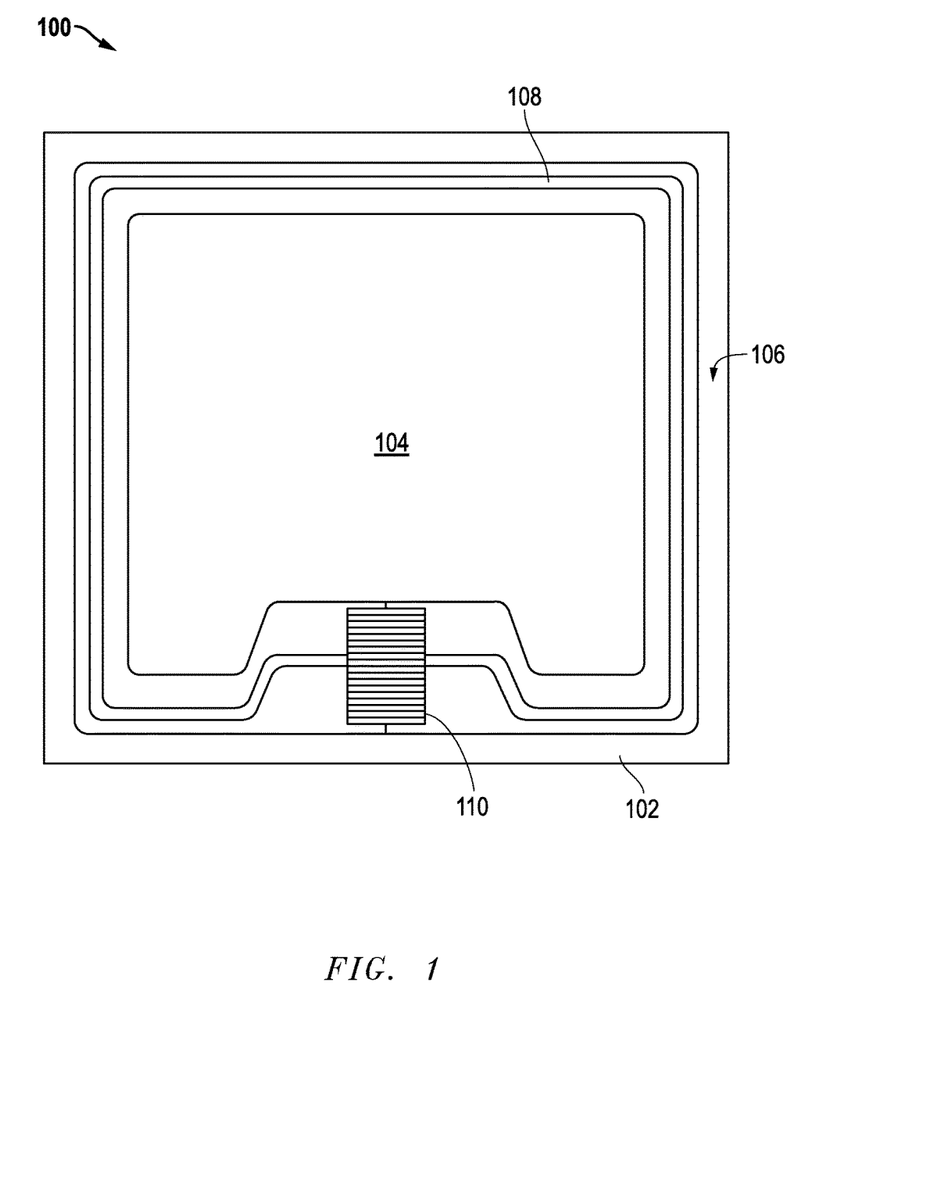
FIG. 1 includes a top view of an electronic device in accordance with an embodiment.

Referring to FIG. 1, an electronic device 100 can generally include a substrate 102 and a semiconductor element 104. At least a portion of the semiconductor element 104 can be disposed on a primary surface 106 of the substrate 102. In an embodiment, the semiconductor element 104 is part of a metal-oxide semiconductor field-effect transistor (MOSFET). In another embodiment, the semiconductor element 104 is part of an insulated gate bipolar transistor (IGBT). The semiconductor element 104 can operate at high voltages, such as at least 400 V, at least 500 V, at least 1000 V, or even at least 2000 V. In an embodiment, the electronic device 100 can operate with a voltage difference between a gate and collector of at least 400 V.

A peripheral region of the electronic device 100, at least partially surrounding the semiconductor element 104, can include guard rings 108 to maintain breakdown voltage of the electronic device 100 while reducing the area of the peripheral region. Specifically, inclusion of guard rings 108 can reduce the width of the peripheral region of the electronic device 100 without reducing breakdown voltage. As discussed in greater detail below, the guard rings 108 can include a plurality of guard rings, such as two guard rings, three guard rings, four guard rings, or five guard rings. Moreover, the number of guard rings 108 can be greater than five in certain configurations. In a particular instance, at least one of the guard rings 108 substantially completely surrounds the semiconductor element 104. In a further embodiment, all of the guard rings 108 substantially completely surround the semiconductor element 104. In a more particular embodiment, at least one, such as all, of the guard rings 108 entirely surround the semiconductor element 104. The guard rings 108 can be spaced apart from the semiconductor element 104 such that they do not directly contact the semiconductor element 104.

In an embodiment, the guard rings 108 all have the same conductivity type. For example, the guard rings 108 can all be n-type or all be p-type. The guard rings 108 can be formed by diffusion, implant, deposition, another method, or any combination thereof. In a particular instance, the guard rings 108 have a dopant concentration of $10^{17}$ to $10^{18}$ atoms/cc.

A clamp diode 110 (sometimes referred to as a "back-to-back diode") can extend through the peripheral region of the electronic device 100 toward the semiconductor element 104. Because the clamp diode 110 is formed in only a portion on the peripheral region, the width of the remaining peripheral region can be reduced. As described in greater detail below, the voltage potential of each guard ring 108 can be matched to the potential of the clamp diode region positioned directly there above, such that the guard rings 108 operate at different potentials with respect to one another.

Figure 2:
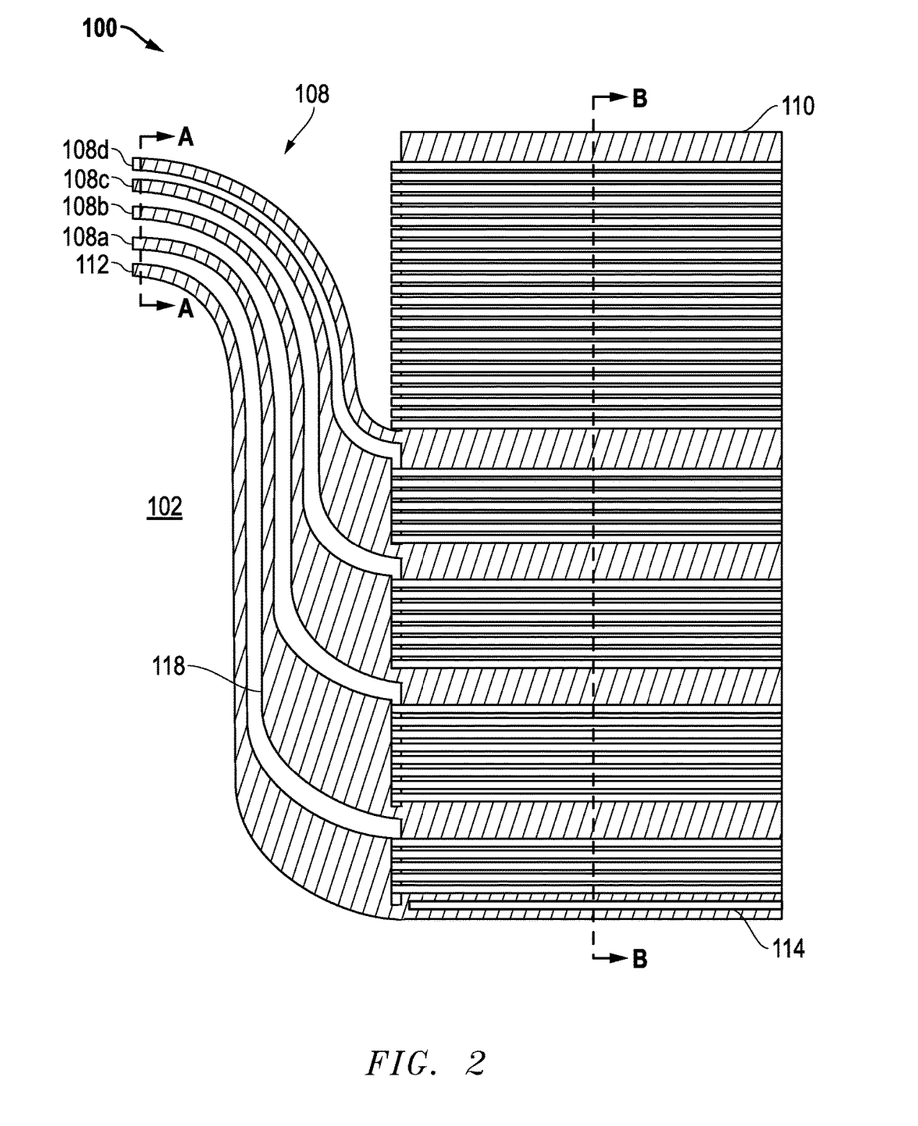
FIG. 2 includes an enlarged top view of a portion of the electronic device in accordance with an embodiment.

FIG. 2 is an enlarged view of a portion of the electronic device 100 where the clamp diode 110 is positioned. The clamp diode 110 can include alternating p-type regions and n-type regions. In particular embodiments, the clamp diode 110 can include at least 25 alternating p-type and n-type regions, at least 50 alternating p-type and n-type regions, or at least 75 p-type or n-type regions. The alternating p-type and n-type regions can have lengths extending parallel, or generally parallel, with a side edge of the semiconductor element 104 (FIG. 1). The clamp diode 110 can be disposed on a field isolation region (not illustrated), such as an oxide, with optional impurity regions therebelow. In the region immediately below the clamp diode 110, the clamp diode 110 can function as a field plate. The clamp diode 110 can be coupled (e.g., electrically coupled) to at least one, such as all, of the guard rings 108. The clamp diode 110 can be coupled to at least one guard ring 108 at a location adjacent to a flared portion of the guard ring 108. In an embodiment, the p-type and n-type regions of the clamp diode 110 can be coupled to the guard rings 108 by contacts formed from metal or otherwise conductive material. The contacts can extend from the p-type and n-type regions, through the field isolation region, and contact the guard rings 108 at the surface of the substrate 102. Each guard ring 108 of the plurality of guard rings 108 can be coupled to the clamp diode 110 individually. During fabrication, the contacts may be formed simultaneously to avoid additional process steps.

Figure 4:
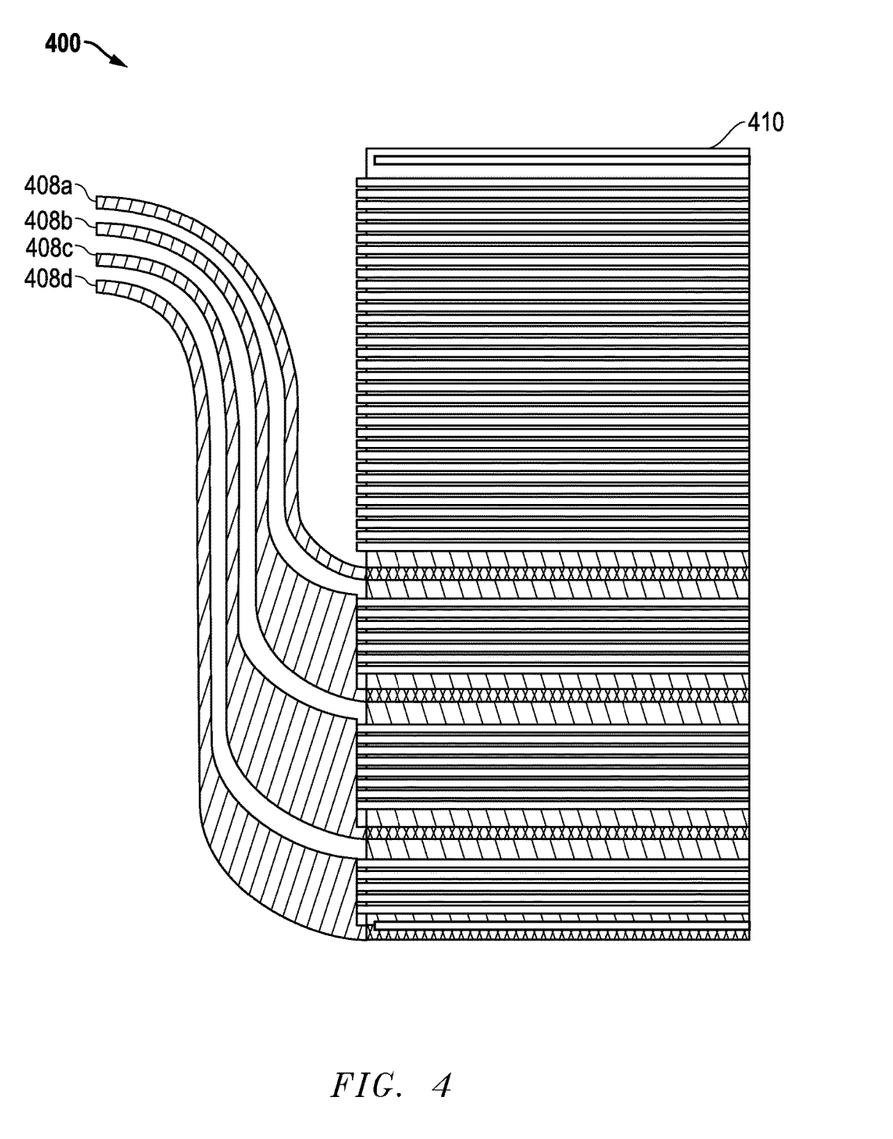
FIG. 4 includes an enlarged top view of a portion of the electronic device in accordance with another embodiment.

In a particular instance, at least one of the p-type and n-type regions of the clamp diode 110 can be laterally spaced apart from the guard rings 108. Referring to FIG. 4, the clamp diode 410 includes larger gaps between the p-type and n-type junctions above the guard rings 408a, 408b, 408c, and 408d. Inclusion of larger gaps can widen the space between PN junctions formed in the clamp diode 410, creating larger potential plateaus. While not illustrated, the gaps between the p-type and n-type junctions can be uniform, and not widened as illustrated.

Figure 5:
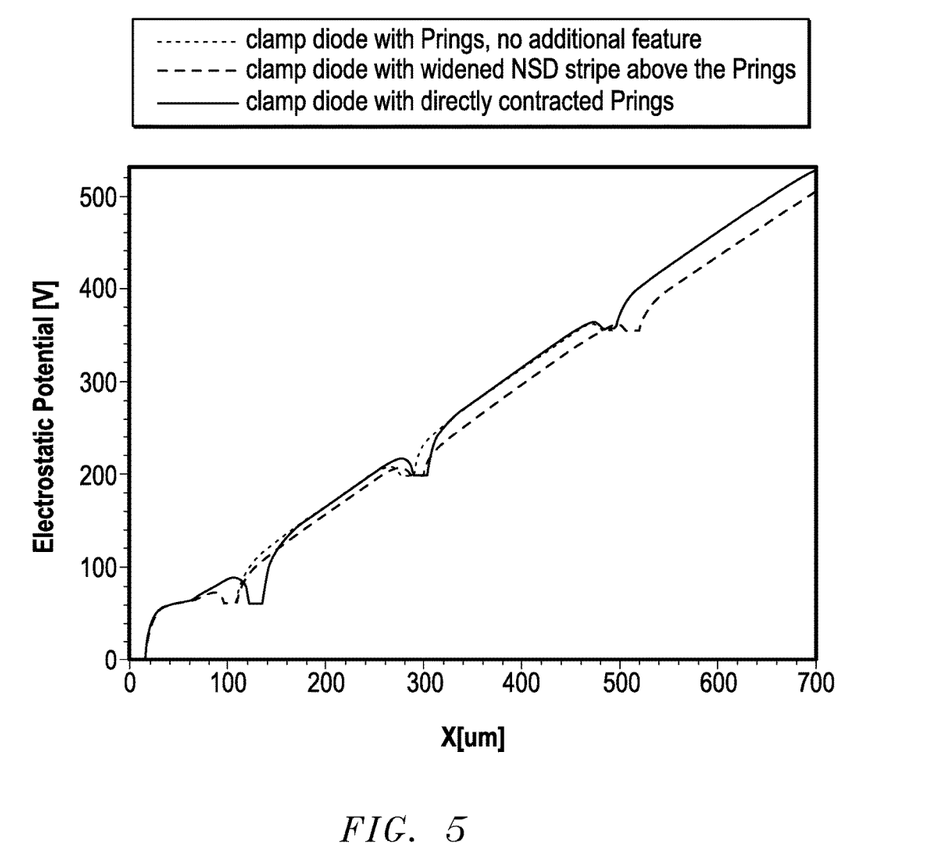
FIG. 5 includes a plot of electrostatic potential of a clamp diode in accordance with various embodiments described herein.

FIG. 5 illustrates the electrostatic potential of devices including clamp diodes 410 with widened gaps between p-type and n-type junctions as illustrated in FIG. 4, clamp diodes with direct contact between the diode 110 and the guard rings 108, and clamp diodes 110 that electrically float relative to the guard rings 108 and include no widened gaps between p-type and n-type junctions.

Referring again to FIG. 2, the p-type and n-type regions of the clamp diode 110 can be formed by forming a polysilicon layer on the substrate 102 or the field isolation region disposed on the substrate 102. The polysilicon layer can then be alternatively doped to form p-type and n-type regions. The size and dopant concentration of the p-type and n-type regions may be varied and are dependent on the application.

In the embodiment illustrated in FIG. 2, the electronic device 100 includes a first guard ring 108a, a second guard ring 108b, a third guard ring 108c, and a fourth guard ring 108d. The number of guard rings can be changed and is not intended to be limited to the four guard ring arrangement as illustrated. A gate ring 112 can also extend at least partially around the semiconductor element 104. The gate ring 112 can be disposed adjacent to the first guard ring 108a, in electrical communication with a gate contact 114 of the clamp diode 110.

Figure 6:
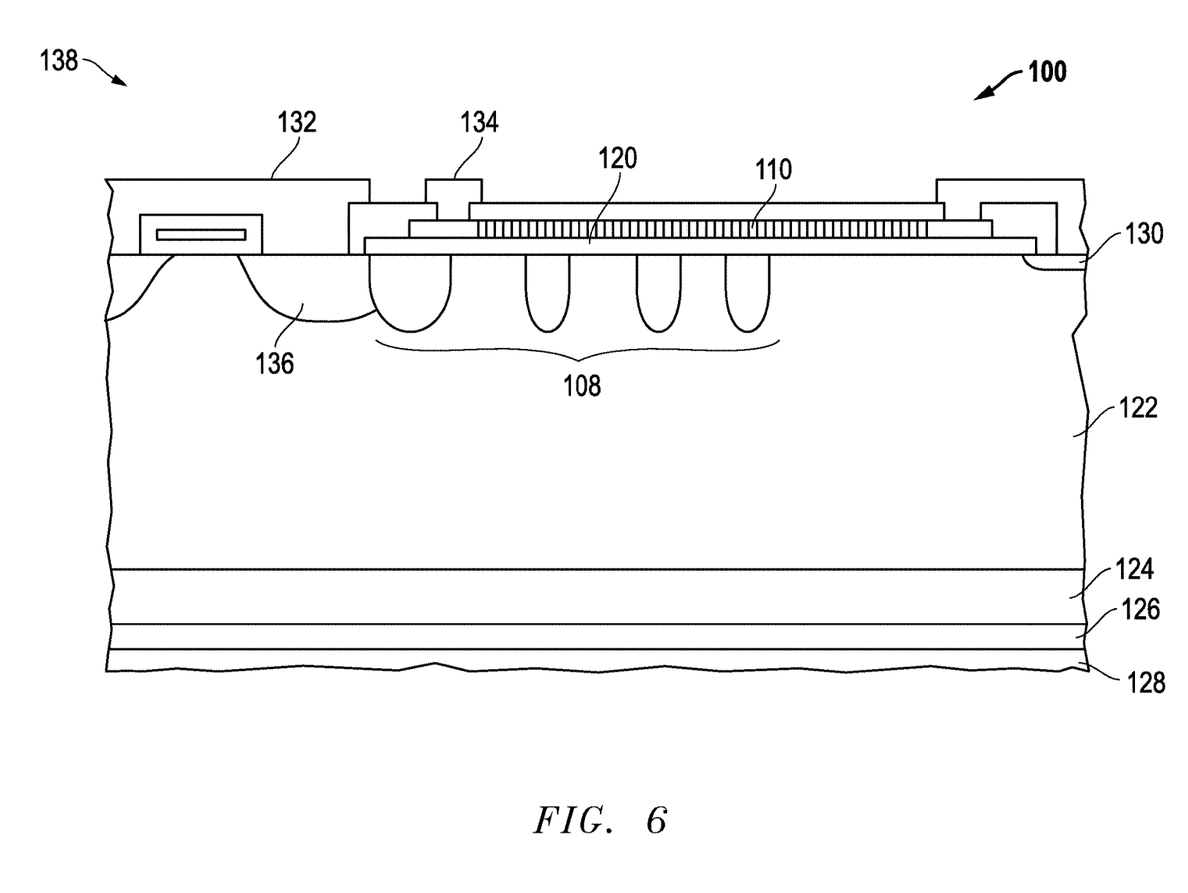
FIG. 6 includes a cross-sectional side view of the electronic device of FIG. 2, as seen along Line B-B in FIG. 2.

FIG. 6 illustrates a cross-sectional side view of the electronic device 100 as seen along Line B-B in FIG. 4. The clamp diode 110 is disposed above a field isolation region 120 which is disposed over a semiconductor region 122 of the substrate 102/126. In an embodiment, the semiconductor region 122 can be part of an epitaxial layer having a light dopant concentration. Other layers underlying the semiconductor region 122 can include a buffer layer 124, a drain region (substrate) 126, and a back contact layer (drain contact) 128. The semiconductor region 122 and buffer layer 124 can have a first conductivity type (e.g., n-type) while the drain region 126 can have a second conductivity type (e.g., p-type). A drain contact 130 can be positioned below the primary surface 106, offset from the field isolation region 120. An active structure of the device 100 can include a source contact 132 and a gate contact 134. A base region 136 can be coupled to the source contact 132. A transistor structure 138 is illustrated The guard rings 108/408 can extend into the semiconductor region 122 from the primary surface 106. The guard rings 108/408 can be disposed at least partially below the primary surface 106 of the semiconductor region 122 of the substrate 102. The guard rings 108/408 can also be positioned below the clamp diode 110.

Referring again to FIG. 2 and FIG. 4, in an embodiment, the guard rings 108a, 108b, 108c, and 108d are all disposed at a same elevation with respect to one another. In another embodiment, at least two of the guard rings 108a, 108b, 108c, or 108d can be disposed at different vertical elevations with respect to one another. FIG. 4 illustrates a partially transparent top view of an exemplary configuration where guard rings 408a, 408b, 408c, and 408d extend below the clamp diode 410. While the guard rings 408a, 408b, 408c, and 408d may not be visible through the clamp diode 410, they are illustrated in FIG. 4 to depict relative position therebetween.

In an embodiment, the heights of the guard rings 108a, 108b, 108c, and 108d can be the same as one another. In another embodiment, at least two of the guard rings 108a, 108b, 108c, and 108d can have different heights as compared to one another.

The guard rings 408a, 408b, 408c, and 408d can be embedded into the substrate 102 or formed from the same layer as the diode 110. In an embodiment, at least one of the plurality of guard rings 408a, 408b, 408c, and 408d can electrically float. The at least one guard ring 408a, 408b, 408c, or 408d can capacitively couple to the clamp diode 110.

The p-type and n-type regions of the clamp diode 110 each have widths, as viewed in cross section. In an embodiment, the width of at least one of the guard rings 108a, 108b, 108c, or 108d can be less than the width of at least one of the p-type and n-type regions. More particularly, the width of the at least one guard ring 108a, 108b, 108c, or 108d can be less than the width of the p-type or n-type region directly there above. The reduction in width of the guard ring relative to the p-type or n-type region of the clamp diode 110 can reduce the potential difference across the width of the clamp diode, which can relieve a potential difference between each of the guard rings 108a, 108b, 108c, and 108d and the clamp diode 110 on its high voltage side. As a result, the breakdown voltage is not reduced. In another embodiment, the width of at least one of the guard rings 108a, 108b, 108c, or 108d can be equal to the width of at least one of the p-type and n-type regions. More particularly, the width of the at least one guard ring 108a, 108b, 108c, or 108d can be equal to the width of the p-type or n-type region directly there above. In a further embodiment, the width of at least one of the guard rings 108a, 108b, 108c, or 108d can be greater than the width of at least one of the p-type and n-type regions. More particularly, the width of the at least one guard ring 108a, 108b, 108c, or 108d can be greater than the width of the p-type or n-type region directly there above.

In an embodiment, a center axis of at least one of the guard rings 108a, 108, 108c, or 108d can be directly vertically below a center axis of the overlying n-type or p-type region of the clamp diode 110. In another embodiment, the center axis of at least one of the guard rings 108a, 108b, 108c, or 108d can be laterally offset from the overlying n-type or p-type region of the clamp diode 110.

As illustrated, the distance between adjacent guard rings 108a, 108b, 108c, and 108d can be substantially uniform as measured at locations adjacent to the clamp diode 110. In a particular embodiment, the distance between adjacent guard rings can be substantially uniform as measured along the entire lengths of the guard rings 108a, 108b, 108c, and 108d. That is, the guard rings 108a, 108b, 108c, and 108d can be spaced apart from one another by substantially uniform distances as measured along their entire lengths.

At least one of the guard rings 108a, 108b, 108c, or 108d can include a flared portion 118. The guard ring 108a, 108b, 108c, or 108d can have a width, $W_F$, at the flared portion 118 greater than the width, $W_{GR}$, of the guard ring 108a, 108b, 108c, or 108d at other locations not at the flared portion 118. In an embodiment, $W_F$ is at least 101% $W_{GR}$, at least 105% $W_{GR}$, at least 150% $W_{GR}$, at least 200% $W_{GR}$, or at least 500% $W_{GR}$. In another embodiment, $W_F$ is in a range between and including 101% $W_{GR}$ and 500% $W_{GR}$, in a range between and including 150% $W_{GR}$ and 450% $W_{GR}$, or in a range between and including 250% $W_{GR}$ and 300% $W_{GR}$.

As illustrated, the flared portion 118 can terminate a distance from the clamp diode 110. That is, the flared portion 118 may not extend directly below the clamp diode 110. Instead, the guard ring 108a, 108b, 108c, or 108d can have a width less than the width of the flared portion 118 at locations directly underlying the clamp diode 110. In an embodiment, the guard rings 108a, 108b, 108c, and 108d can taper to a narrow width at a location spaced apart from the clamp diode 110. As illustrated in FIG. 2, the guard rings 108a, 108b, 108c, and 108d immediately reduce in thickness without inclusion of a tapered region.

The spacing between adjacent guard rings 108a and 108b, 108b and 108c, and 108c and 108d can be uniform, or substantially uniform, as measured at the flared portion 118 and the non-flared portions. Thus, the maximum width of the guard rings 108 (i.e., the distance between guard ring 108a and 108d can be greater at the flared portion 118 as compared to the non-flared portion by a distance equal to the width of the flared portion 118 of all flared guard rings.

In an embodiment, the flared portions 118 of at least two of the guard rings 108a, 108b, 108c, and 108d can have the same widths as one another. In another embodiment, the flared portions 118 of at least two of the guard rings 108a, 108b, 108c, and 108d can have different widths as compared to one another. The flared portions 118 of the guard rings 108a, 108b, 108c, and 108d can have similar or different profiles, different widths, different radii of curvature, or any other different characteristics which are not equally shared amongst all guard rings 108a, 108b, 108c, and 108d.

In an embodiment, at least one of the plurality of guard rings 108a, 108b, 108c, and 108d is free, or essentially free, of a flared portion. That is, at least one of the plurality of guard rings 108a, 108b, 108c, and 108d can have a uniform, or generally uniform, width as measured along the length thereof. In a particular embodiment, the guard ring 108a, 108b, 108c, or 108d free, or essentially free, of the flared portion can be an outermost or innermost guard ring (e.g., guard ring 108a or 108d). In a particular embodiment, illustrated in FIG. 2, guard ring 108d is free, or essentially free, of the flared portion.

The guard rings 108a, 108b, 108c, and 108d can be biased to different potentials which can be determined from the potential of the p-type and n-type regions of the clamp diode 110. Equation 1, below, illustrates an exemplary biasing configuration for a given geometric progression.

$$V_n = V_1 a^{n-1} \qquad \text{(Equation 1)}$$

Equation 1 describes an exemplary biasing progression where $V_n$ is the bias for the $n^{th}$ guard ring, $V_1$ is the bias of the first guard ring, and a is a common ratio. The guard rings can be electrically connected to a voltage supply terminal (not illustrated) to bias the guard rings to the desired biasing potentials. In a particular instance, the guard rings 108a, 108b, 108c, and 108d can be biased to a voltage that is within 10% of $V_n$. In a more particular instance, the guard rings 108a, 108b, 108c, and 108d can be biased to a voltage within 5% of $V_n$, within 2% of $V_n$ or within 1% $V_n$.

Figure 3:
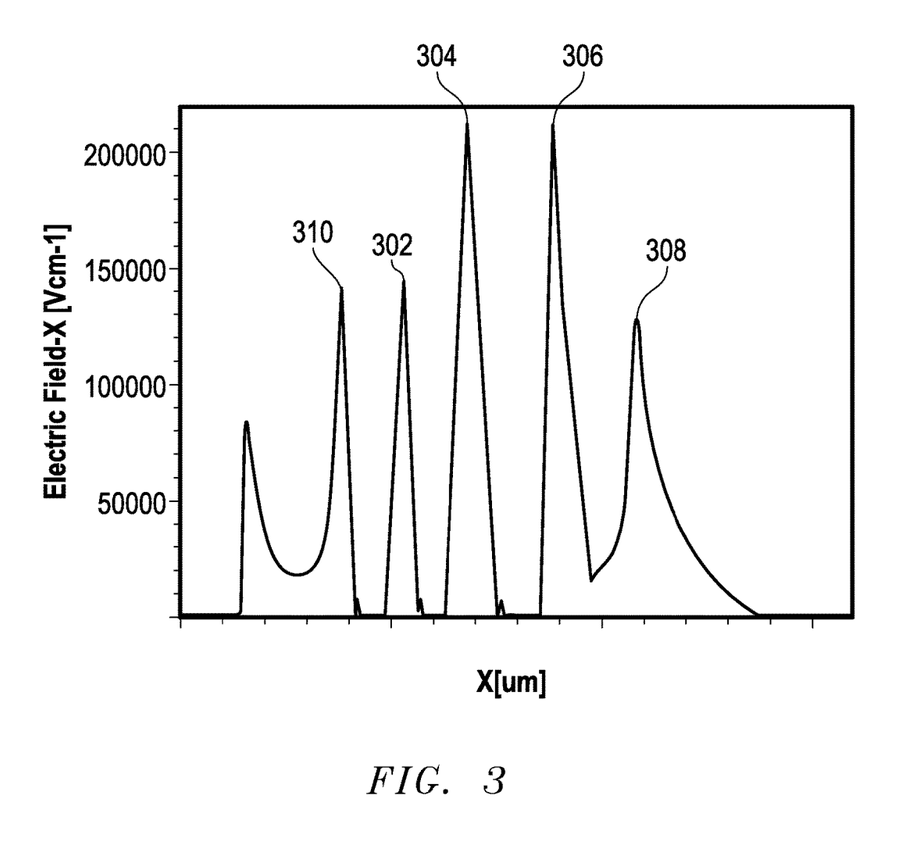
FIG. 3 includes a plot of electrical field distribution for an exemplary biasing configuration for the guard rings.

FIG. 3 illustrates an exemplary electric field distribution as seen along Line A-A in FIG. 2 based on Equation 1, above. Electrical bias of guard ring 108a is illustrated at peak 302, electrical bias of guard ring 108b is illustrated at peak 304, electrical bias of guard ring 108c is illustrated at peak 306, and electrical bias of guard ring 108d is illustrated at peak 308. The gate ring 112 is biased as illustrated by peak 310.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising:
a substrate;
a semiconductor element disposed on the substrate; and
a plurality of guard rings at least partially surrounding the semiconductor element, wherein:
adjacent guard rings are spaced apart by a substantially uniform distance as measured along an entire length of the guard rings, and
at least one of the plurality of guard rings has a flared portion.

Embodiment 2

The electronic device of embodiment 1, wherein the substrate has a primary surface, and wherein the plurality of guard rings are disposed at least partially below the primary surface of the substrate.

Embodiment 3

The electronic device of embodiment 1, wherein at least one of the plurality of guard rings electrically floats.

Embodiment 4

The electronic device of embodiment 1, wherein the guard rings substantially completely surround the semiconductor element.

Embodiment 5

The electronic device of embodiment 1, further comprising:
a field isolation region disposed on the substrate above the plurality of guard rings; and
a diode disposed on the field isolation region at least partially above the plurality of guard rings,
wherein the diode is coupled to at least one of the plurality of guard rings at a location adjacent to the flared portion.

Embodiment 6

The electronic device of embodiment 1, wherein each guard ring of the plurality of guard rings is electrically connected to a voltage supply terminal, and wherein the plurality of guard rings are adapted to operate with different voltage potentials as compared to each other.

Embodiment 7

The electronic device of embodiment 1, wherein at least two of the plurality of guard rings have a substantially same width as measured at a first location, and wherein the widths of the at least two guard rings are different as measured at the flared portions.

Embodiment 8

The electronic device of embodiment 1, wherein at least one of the plurality of guard rings is substantially free of a flared portion.

Embodiment 9

The electronic device of embodiment 1, wherein the electronic device is adapted to operate with a voltage difference between a gate and collector of at least 400 Volts.

Embodiment 10

An electronic device comprising:
a substrate;
a semiconductor element disposed on the substrate;
a diode electrically connecting an electrode to the semiconductor element; and
a plurality of guard rings at least partially surrounding the semiconductor element,
wherein a width of at least one of the plurality of guard rings is different at a location adjacent to the diode as compared to a location below the diode.

Embodiment 11

The electronic device of embodiment 10, wherein the guard rings are part of a same conductive layer as the diode.

Embodiment 12

The electronic device of embodiment 10, wherein the diode and guard rings are at a same elevation.

Embodiment 13

The electronic device of embodiment 10, wherein the diode is a clamp diode including a series of n-type regions and p-type regions, and wherein at least one of the n-type regions of the clamp diode has a width greater than or equal to the width of at least one guard ring of the plurality of guard rings, as measured at a location under the clamp diode.

Embodiment 14

The electronic device of embodiment 10, wherein the electronic device is adapted to operate with a voltage difference between a gate and collector of at least 400 Volts.

Embodiment 15

The electronic device of embodiment 10, wherein the electronic device is a high voltage MOSFET or an IGBT.

Embodiment 16

The electronic device of embodiment 10, further comprising:
a field isolation region disposed on the substrate above the plurality of guard rings,
wherein the diode is disposed on the field isolation region and electrically connected to the plurality of guard rings through the field isolation region.

Embodiment 17

The electronic device of embodiment 10, wherein at least one of the guard rings includes a flared portion, and wherein the flared portion of the at least one guard ring is adjacent to the diode.

Embodiment 18

The electronic device of embodiment 10, wherein the plurality of guard rings electrically float.

Embodiment 19

A method of using an electronic device comprising:
providing an electronic device including a plurality of guard rings at least partially surrounding a semiconductor element; and
biasing the plurality of guard rings each to a voltage that is within 10% of $V_N$, which is defined by the equation $V_N = V_1 a^{N-1}$.

Embodiment 20

The method of embodiment 19, wherein the electronic device comprises the electronic device of embodiment 1.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

The invention claimed is:

1. An electronic device comprising:
a substrate;
a semiconductor element disposed on the substrate;
a plurality of guard rings at least partially surrounding the semiconductor element, wherein:
adjacent guard rings are spaced apart by a substantially uniform distance as measured along an entire length of the guard rings, each pair of adjacent guard rings being spaced apart substantially the same distance as each other pair of adjacent guard rings, and
at least one of the plurality of guard rings has a widest, flared portion;
a field isolation region disposed on the substrate above the plurality of guard rings; and
a diode disposed on the field isolation region and coupled to at least one of the plurality of guard rings;
wherein a portion of the at least one of the plurality of guard rings extending between the widest, flared portion and the diode is narrower than the widest, flared portion.

2. The electronic device of claim 1, wherein the substrate has a primary surface, and wherein the plurality of guard rings are disposed at least partially below the primary surface of the substrate.

3. The electronic device of claim 1, wherein at least one of the plurality of guard rings electrically floats.

4. The electronic device of claim 1, wherein the guard rings substantially completely surround the semiconductor element.

5. The electronic device of claim 1, wherein each guard ring of the plurality of guard rings is electrically connected to a voltage supply terminal, and wherein the plurality of guard rings are adapted to operate with different voltage potentials as compared to each other.

6. The electronic device of claim 1, wherein at least two of the plurality of guard rings have a substantially same width as measured at a first location, and wherein the widths of the at least two guard rings are different as measured at the widest, flared portions.

7. The electronic device of claim 1, wherein at least one of the plurality of guard rings is substantially free of a widest, flared portion.

8. The electronic device of claim 1, wherein the electronic device is adapted to operate with a voltage difference between a gate and collector of at least 400 Volts.

9. An electronic device comprising:
a substrate;
a semiconductor element disposed on the substrate;
a diode electrically connecting an electrode to the semiconductor element; and
a plurality of guard rings at least partially surrounding the semiconductor element, at least one of the plurality of guard rings has a widest, flared portion;

wherein a portion of the at least one of the plurality of guard rings extending between the widest, flared portion and the diode is narrower than the widest, flared portion;

wherein the plurality of guard rings are spaced apart by a substantially uniform distance as measured along an entire length of the guard rings, each pair of adjacent guard rings being spaced apart substantially the same distance as each other pair of adjacent guard rings.

10. The electronic device of claim 9, wherein the guard rings are part of a same conductive layer as the diode.

11. The electronic device of claim 9, wherein the diode and guard rings are at a same elevation.

12. The electronic device of claim 9, wherein the diode is a clamp diode including a series of n-type regions and p-type regions, and wherein at least one of the n-type regions of the clamp diode has a width greater than or equal to the width of at least one guard ring of the plurality of guard rings, as measured at a location under the clamp diode.

13. The electronic device of claim 9, wherein the electronic device is adapted to operate with a voltage difference between a gate and collector of at least 400 Volts.

14. The electronic device of claim 9, wherein the electronic device is a high voltage MOSFET or an IGBT.

15. The electronic device of claim 9, further comprising:
a field isolation region disposed on the substrate above the plurality of guard rings, wherein the diode is disposed on the field isolation region and electrically connected to the plurality of guard rings through the field isolation region.

16. The electronic device of claim 9, wherein the plurality of guard rings electrically float.

17. A method of using an electronic device comprising:
providing an electronic device including a plurality of guard rings at least partially surrounding a semiconductor element disposed on a substrate, at least one of the plurality of guard rings has a widest, flared portion;

providing a field isolation region disposed on the substrate above the plurality of guard rings;

providing a diode disposed on the field isolation region and coupled to at least one of the plurality of guard rings;

wherein a portion of the at least one of the plurality of guard rings extending between the widest, flared portion and the diode is narrower than the widest, flared portion;

biasing the plurality of guard rings each to a voltage that is within 10% of $V_N$, which is defined by the equation $V_N = V_1 a^{N-1}$;

wherein adjacent guard rings are spaced apart by a substantially uniform distance as measured along an entire length of the guard rings, each pair of adjacent guard rings being spaced apart the same distance as each other pair of adjacent guard rings.

* * * * *